United States Patent [19]

Goldstein

[11] Patent Number: 5,559,057
[45] Date of Patent: Sep. 24, 1996

[54] METHOD FOR DEPOSITING AND PATTERNING THIN FILMS FORMED BY FUSING NANOCRYSTALLINE PRECURSORS

[75] Inventor: Avery N. Goldstein, Midland, Mich.

[73] Assignee: Starfire Electgronic Development & Marketing Ltd., Bloomfield Hills, Mich.

[21] Appl. No.: 217,161

[22] Filed: Mar. 24, 1994

[51] Int. Cl.$^6$ .......................... H01L 21/20; H01L 21/44; G02B 6/00; G02F 1/00
[52] U.S. Cl. .......................... 437/228; 437/233; 437/234; 437/245; 216/40; 156/659.11; 385/122; 359/326
[58] Field of Search .................................... 437/233, 234, 437/967, 247, 228, 245; 216/40; 156/659.1; 385/122; 359/326

[56] References Cited

U.S. PATENT DOCUMENTS 5,262,357  11/1993  Alivisatos et al. ...................... 437/233

OTHER PUBLICATIONS

*Science;* Goldstein, A., Echer, C., Alivisatos, A., Jun. 1992, vol. 256, pp. 1425–1427, "Melting in Semiconductor Nanocrystals".
*Physical Review A;* Buffat, Ph., Borel, J–P., vol. 13, No. 6, Jun. 1976 "Size effect on the melting temperature of gold particles".
*Physical Review Letters;* Erolessi, F., Andreoni, W., Tosatti, E., vol. 66, No. 7, Feb. 91 "Melting of Small Gold Particles".
*J. Phys. D: Appl Phys;* Wautelet, M., vol. 24, pp. 343–346 (1991) "Estimation of the variation of the melting temperature with the size of small particles . . . ".
*Physical Review A;* Berry, R., Jellinek, J., Natanson, G., vol. 30, No. 2, "Melting of clusters and melting".
Y. Wada; T. Kure; T. Yoshimura; Y. Sudo; T. Kobayashi; Y. Goto; S. Kondo; *Fabrication of Less Than a 10 nm Wide Polycrystalline Silicon Nano Wire*, Jpn. J. Appl. Phys., vol. 33 (1994), pp. 905–908, Jan. 1994.
J. R. Heath, S. M. Gates, C. A. Chess, "Nanocrystal seeding: A low temperature route to polycrystalline Si films", Appl. Phys. Lett. 64(26), 27 Jun. 94, pp. 3569–3571.
G. Samdani, S. Moore, G. Parkinson, "Tiny Particles Aim for Big Markets", Chemical Eng./Aug. 94 pp. 35–39.
'Silicon Proc. in VLSI Era' Wolf, Stanely pp. 535 and 508 (1986).

*Primary Examiner*—R. Bruce Breneman
*Assistant Examiner*—Matthew Whipple
*Attorney, Agent, or Firm*—Gifford, Krass, Groh, Sprinkle, Patmore, Anderson & Citkowski

[57] ABSTRACT

Patterns or circuits of semiconductors or metals are produced with dimensions at least as small as 7 nm using nanocrystalline precursors. The substrate is masked with an electron beam sensitive layer and a pattern is traced using a focused electron beam. Exposure to a source of nanocrystalline material and dissolution of the mask material produces patterned features of nanocrystals. The sample may then be heated to form a bulk thin film or left unheated, preserving the electronic properties of the isolated particles. The process is repeatable with different materials to build laminar structures of metals, semiconductors and insulators.

10 Claims, 5 Drawing Sheets

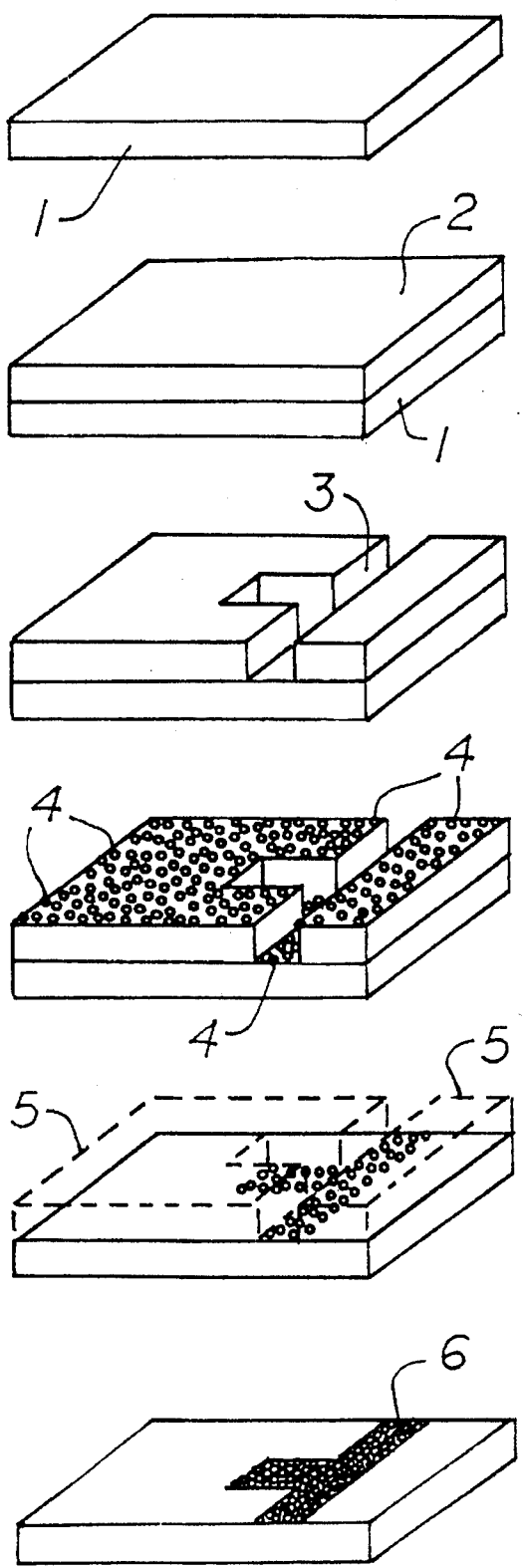
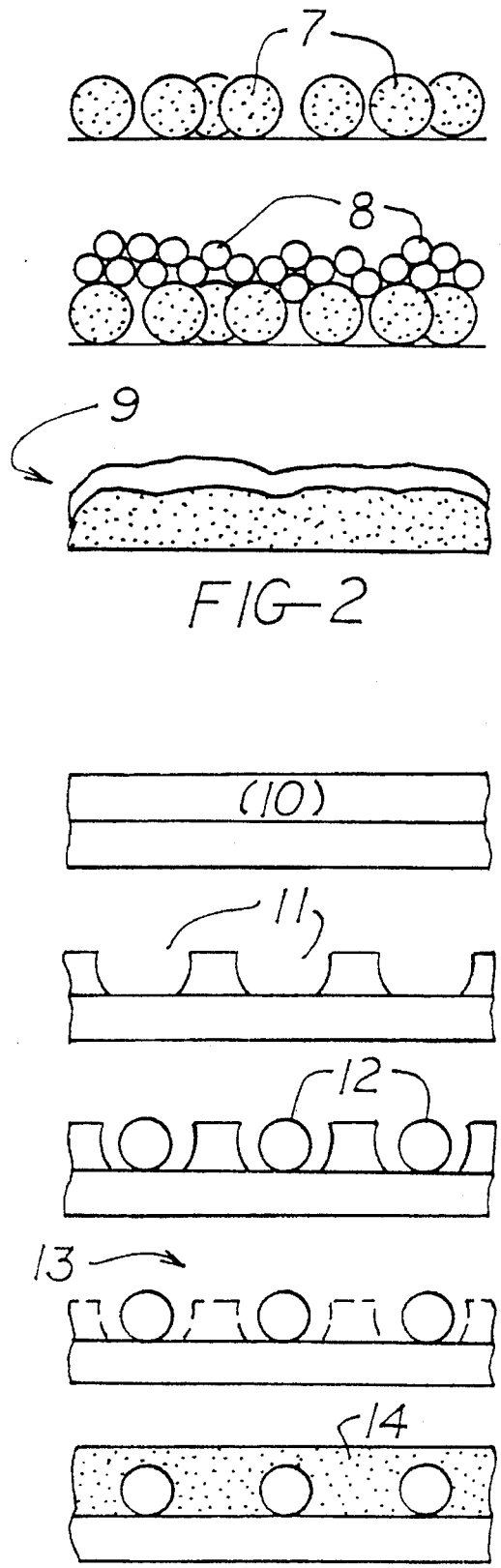
FIG-1
FIG-2
FIG-3

5,559,057

METHOD FOR DEPOSITING AND PATTERNING THIN FILMS FORMED BY FUSING NANOCRYSTALLINE PRECURSORS

FIELD OF THE INVENTION

The present invention relates to thin film formation and, in particular, a process by which thin films of a wide variety of materials can be applied to a substrate in a controlled pattern from nanocrystal precursors.

BACKGROUND OF THE INVENTION

The patterning of fine features for the production of electronic circuitry currently involves the use of photoresistive masking materials which are selectively dissolvable in solvents upon light exposure and followed by material evaporation. Such manufacturing methods exhibit a variety of shortcomings. Feature resolution is limited by the undercutting of features by chemical dissolution which precludes distinct steps in the masking materials as well as in the final features. Fine features are also limited by the photon source dispersion and wavelength in the light exposure step. Furthermore, such processes require the use of large quantities of toxic and corrosive solvents.

SUMMARY OF THE INVENTION

The present invention provides a method for producing fine detail thin film patterns from a variety of materials using nanocrystalline precursors. A nanocrystal is defined as a crystalline particle with dimensions on the nanometer length scale, 1 to 100 nm. Fine detail thin film patterns according to the present invention comprise defined, continuous regions 7 nm or less to 500 nm in width of a material on a substrate.

A method for manufacturing fine detail thin film patterns according to the present invention comprises the steps of (i) providing a substrate; (ii) depositing a layer of an electron irradiation sensitive material on the substrate; (iii) patterning the substrate by exposure to a focused electron beam; (iv) exposure of the substrate to gas phase or colloidal solution of nanocrystals so as to form a contiguous layer; (v) dissolution of the remaining electron irradiation sensitive material; and (vi) sintering of the nanocrystals. Successive repetitions of the steps serves to construct multi-laminar patterns which have applications in electronics, including superlattices and quantum well structures.

Another embodiment of this invention is in the formation of ordered arrays of semiconductor nanocrystals with the deletion of step (vi).

BRIEF DESCRIPTION OF THE DRAWINGS

FIG. 1 is a schematic of processing steps used to generate patterned thin films from nanocrystal precursors;

FIG. 2 is a schemtic sectional view of the sequence involved in stabilizing a material to disproportionation by cosintering with an overlayer;

FIG. 3 is a schematic sectional view of processing steps used to generate a film containing isolated nanocrystals for use in nonlinear optical devices;

DETAILED DESCRIPTION OF THE INVENTION

Figure 4:
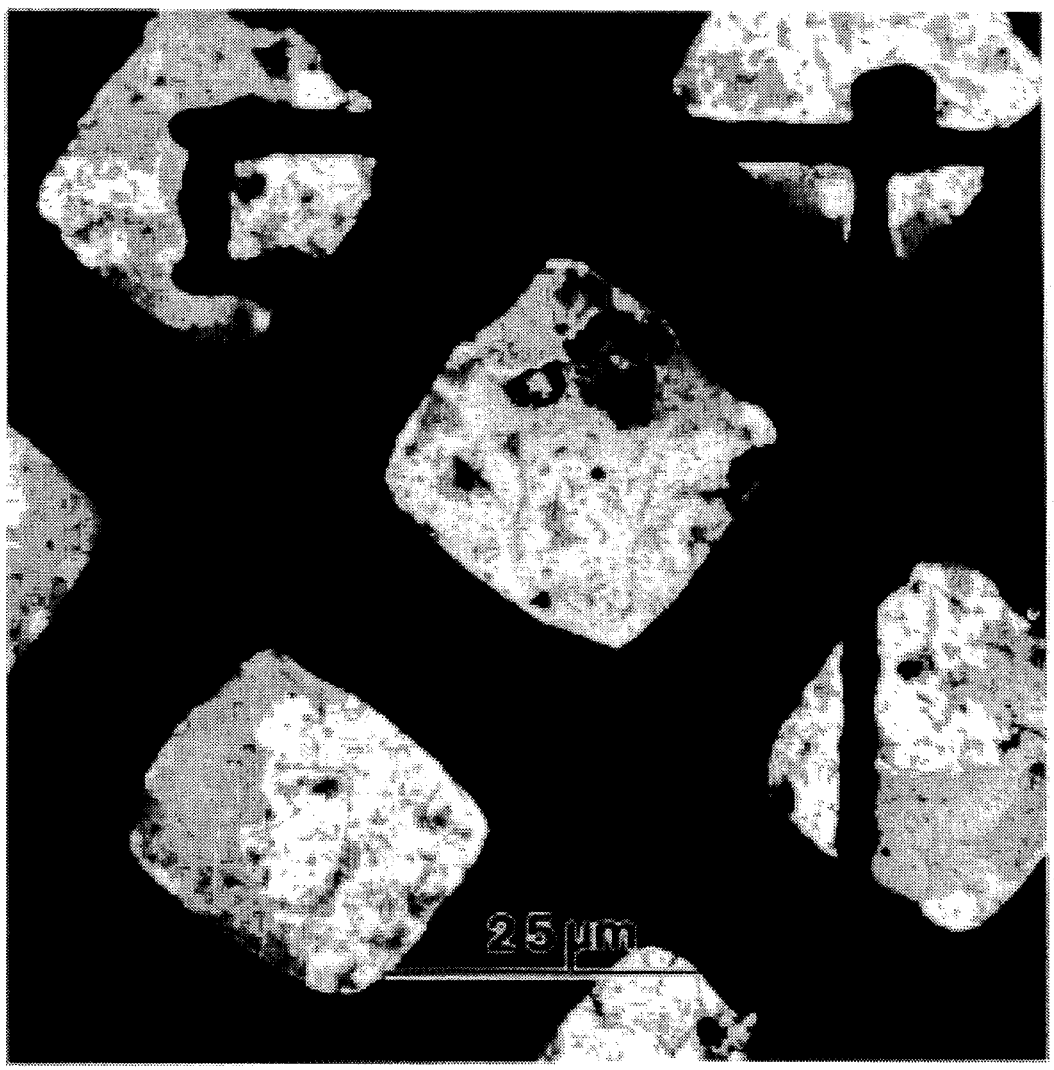
FIG. 4 is a low magnification transmission electron micrograph showing a thin film formed by exposing an electron beam irradiated substrate to a colloidal solution of CdS particles and sintering, wherein electron dense orthogonal tracts of CdS are visible transecting several grid squares.

It is an advantage of the manufacturing method according to the present invention that nanocrystals are selectively applied to a substrate and subsequently processed to serve a variety of functions.

Semiconductor nanocrystals are known to exhibit quantum confinement effects. Such arrays have applications in nonlinear optics. This method represents a superior level of ordering compared to present methods which are described in more detail in M. Yoshida et al., U.S. Pat. No. 5,113,473 (1992), which is incorporated herein by reference.

FIG. 1 shows steps associated with the structured patterning of a thin film according to the present invention. An irradiation sensitive material, 2 of sufficiently low vapor pressure such as organic polymers of aliphatic hydrocarbons or amino acids are applied as a thin film to the substrate 1. The irradiation sensitive materials are presented here as examples and do not encompass all the materials that will suffice herein. It is important that the coating material wet the substrate and form at least a monolayer; a maximal thickness is empirically determined for a variety of materials, above which photolysis gradually becomes inhibited.

The nature of the substrate is limited only in its stability to the processing sequence according to the invention. In the most severe manifestation, the restrictions require stability towards: (i) modest electron beam dosage; (ii) organic solvents and (iii) the heating required to induce coalescence of the nanocrystals into a continuous film. The heat required is less than the bulk sintering temperature and relates to the size and nature of the nanocrystal. A discussion of the reduced processing temperature of nanocrystals is found in Ph. Buffat and J. P. Borel, *Phys, Rev. A*(1976)13:2287 and incorporated herein by reference. These substrate requirements allow for the use of a variety of material classes including metals, inorganic glasses, ceramics and insulators.

The irradiation sensitive material coated substrate is then placed under vacuum and exposed to an electron beam of sufficient energy and duration so as to selectively decompose the particular coating as shown schematically as a "T"-shape 3. Typically electron dosages of $1 \times 10^{-2}$ C/cm$^2$ are required. In its preferred embodiment, this invention requires a vacuum to be purged of residual gases which are reactive towards the substrate under electron beam irradiation conditions. The focus of the electron beam defines the dimensions of thin film structural elements. The beam may be rastered to form continuous tracts, modulated to form isolated pits or a combination thereof. The minimum dimensions attainable for a thin film also depend on the size of nanocrystals used. In order to ensure a contiguous particle dispersion within the tracts or pits over extended distances a minimal focus of five to seven mean particle diameters is required.

The selectively exposed substrate is then introduced to a nanocrystalline particulate which may be either in a gas phase cluster beam or a colloidal dispersion, the particulates being depicted with dots 4. While gas phase condensation of nanocrystals onto the substrate is efficient in that the process can be accomplished within the vacuum environment associated with selective decomposition, it is, however, wasteful of materials and susceptible to density variations across the substrate associated with the cluster beam profile. Alternatively, the use of a colloidal solution allows for the recycling of nanocrystal material and uniform dispersions of particles, Since colloidal nanocrystals have a surface passivating layer to prevent agglomeration in solution. The chemistry of the surface functionality is exploited to recover those nanocrystals which do not adhere to underlying substrate. Colloidal particles may be applied to the substrate either by immersion and washing in a colloidal solution that wets the substrate or by evaporating the solution onto the coated substrate which yields a agglomerated nanocrystals as the solvent droplet disappears.

Following the nanocrystal exposure removal of remaining material 2 is required. The solvent of choice is dictated by the identity of the masking material, with the solvent in which the polymer was dispersed to form the mask being an obvious choice. The substrate should be repeatedly washed in excess solvent to assure the quantitative removal of the masking material, illustrated with broken lines 5 and any nanocrystals adhering to the polymeric material.

In order to form a thin film 6 for use in photoconversion and microelectronic device applications the regions coated with nanocrystals are typically sintered to ensure electrical continuity across the feature. A reduced melting temperature for nanophase metals (C. R. M. Wronski, *Brit. J. Appl. Phys*,. (1967)18:1731; J. F. Pocza, A. Barna and P. B. Barna, *J. Vac. Sci. and Tech.*(1969)6:472; and C. J. Coombes, *J. Phys. F*(1972)2:441) and semiconductors (A. N. Goldstein, C. M. Echer and A. P. Alivisatos, *Science,* (1992)256:1425; and A. N. Goldstein, Ph. D. dissertation, University of California at Berkeley (1993)) has previously been shown; these references are incorporated herein. Due to the depressed melting and sintering temperatures associated with nanocrystalline materials the temperature required to form a continuous thin film is 200, 500 and even 1000K below the temperature required to form the same film from a bulk precursor. The exact fusion temperature is dependent on both the nature of the material and the particle size. In its preferred embodiment this invention utilizes particle diameters ranging from 1 nm to 6 nm. Nanocrystals can be deposited to form multiple layer stacks. Layer thicknesses exceeding upwards of tens of layers begin to show a lateral spreading of the layers and a diminished size dependent melting phenomenon.

Complex structures produced by multiple patterning steps which may utilize different materials are produced by this invention through a repetition of the steps illustrated in FIG. 1. The application of subsequent thin film layers is restricted only by the requirement that additional layers sinter at temperatures lower than that of the underlying layers. A large differential melting temperature between successive layers precludes interdiffusion whereas, marginal differences promotes diffuse interfacial contacts. Nearly any sequence of metallic and semiconductor layers is obtainable through appropriate choice of nanocrystal sizes. These interfacial differences are of added importance in superlattice structure control.

Thermally Unstable Precursor Patterning

The use of some binary semiconductors such as, but not limited to GaAs have an intrinsic problem of disproportionation upon heating (J. R. Arthur, *J. Phys. Chem. Solids*(1967)28:2257; J. C. Garcia, C. Neri and J. Massies,*J. Crystal Growth*(1989)98:511; and J. H. Neave, B. A. Joyce, P. J. Dobson and N. Norton, *Appl. Phys.*(1983)A31:1). The same applies to nanocrystalline phases of these materials. Disproportionation is an incongruent melting process which is driven by the selective loss of one constituent element leaving molten phase enriched in the more stable element.

The present invention is capable of largely overcoming the current difficulties of annealing and processing unstable binary semiconductors. The passivation of a layer of binary semiconductor nanocrystals by an over layer of a stabilizing nanocrystals of lower surface tension, inertness towards the semiconductor and comparable melting temperature serves to minimize disproportintation. In typical applications, metallic nanocrystals serve this purpose. The metallic nanocrystals coat the underlying semiconductor layer due to the lower metallic surface tension and thereby limits volatilization. In a related field, superheating of nanocrystals has been theoretically modelled (J. Broughton, *Phys. Rev. Let.*(1991)67:2990). The sintering of the semiconductor layer then proceeds to form a thin film overcoated by a metal layer. FIG. 2 shows the sequence of events in thermally stabilizing in otherwise volatile semiconductor.

Upon preparing a semiconductor layer 7 as before, exposure to a second type of nanocrystal 8 is required. The overlayer must satisfy the following criteria; i) possession of a lower intrinsic surface tension than the semiconductor material; ii) stability towards chemical reaction with the constituents of the underlying semiconductor layer during the coarse of processing and iii) exhibit a mean particle size such that the two layers of particles coalesce into a film 9 in concert. A large disparity in melting temperatures can lead to dissipation in the layer architecture and undesirable thin film materials.

The necessity of a metallic overlayer to stabilize some semiconductors towards heating serves to provide a contact barrier but may result in some loss in pattern resolution and surface planarity.

Nonlinear Optical Device Patterning

A similar technique to that described in FIG. 1 is useful in forming structures with applications in nonlinear optics. As shown in FIG. 3, an electron beam-sensitive layer 10 is coated onto a substrate as in FIG. 1. An array of holes 11 are then formed into the organic film with a tightly focused electron beam. The diameter of the hole is such that a single or few nanocrystals 12 are capable of filling each void. Colloidal nanocrystals of Group I–VII compounds such as CuCl, Group II–VI compounds such as GaS, GaSe, CdO, CdTe, ZnSe, ZnO, ZnTe or HgTe and mixed Group II–VI materials such as CdSSe, Group III–V compounds such as GaAs, GaP, GaSb, InAs, GaAlAs or InAlSb and group IV elemental semiconductors Si or Ge illustrate the range of materials useful in this manifestion of the invention. In its preferred embodiment this invention, nanocrystals of a size close to the exciton diameter for the material are deposited onn the patterned substrate since the bandgap is size dependent in this size regime. The remaining organic material is then washed from the substrate 13. The array of nanocrystals that alone or in small clusters represent quantum dots are then covered by evaporating an optically transparent material onto them. Layers of embedded nanocrystals can be laminated together 14 or the previous layer may serve as a substrate if the optically transparent material is stable towards processing steps described in relation to FIG. 1. Choices for an optically transparent material include any material which is optically transparent in the wavelength range associated with the emissions of nanocrystalline semiconductors; inorganic glasses and organic polymers are often satisfactory in this application.

This invention will be described by the following examples which are presented to illustrate the invention, but not to limit its scope which is defined by appended claims.

EXAMPLE 1

A 30 nm thick aluminum film was prepared by vacuum evaporation of the high purity metal onto a cleaved sodium chloride crystal. The aluminum coated salt crystal is then immersed in methanol in order to float the aluminum film free of the crystal. The aluminum film is then collected from the methanol surface and supported by a 300 mesh copper grid. The aluminum film serves as the substrate for patterning and thin film growth. The aluminum film is polycrystalline with an average domain size of 40 nm.

A 5% by weight paraffin solution in toluene is prepared by dissolution and the grid with the aluminum overlayer immersed in this solution and allowed to dry. A thin paraffin coating results.

The grid is then placed in a JEOL 100CX transmission electron microscope which has previously been aligned and the beam condensed to an intense spot of 50 nm. The sample chamber is evacuated to a pressure of better than $2 \times 10^{-7}$ torr. The filament is then energized and brought to saturation without spreading the beam. Through the use of manual translation controls a distinct pattern of orthogonal tracts is traced onto the paraffin coated aluminum film. Reaction of the paraffin is indicated by an instantaneous flicker of the region under irradiation, followed by an increase in transmitted electron intensity. A loss of the paraffin overlayer is consistent with these observations.

Upon the withdrawal of the grid from microscope vacuum a droplet of concentrated colloidal aqueous CdS nanocrystals of 5 nm average diameter is placed on the grid with care taken to prevent exposure of the reverse side of the grid to the solution. The droplet is allowed to dry on the grid.

The nanocrystal coated grid is then washed repeatedly in toluene in order to remove paraffin overlayer. Microscopy of the grid shows nanocrystals to be present only in selected regions, consistent with the beam rastering process, FIG. 4.

The colloidal CdS nanocrystals used in this experiment are prepared in an acidic solution with mercaptoacetic acid functioning as the surface passivating molecule. Mercaptoacetic acid serves to prevent agglomeration, input solubility to the particles and provide a functionality that is exploited to enhance bonding to the substrate. The synthetic method is described elsewhere (V. L. Colvin, A. N. Goldstein and A. P. Alivisatos, *J. Am. Chem. Soc.*(1992)114:5221) and incorporated herein by reference.

EXAMPLE 2

Figure 5:
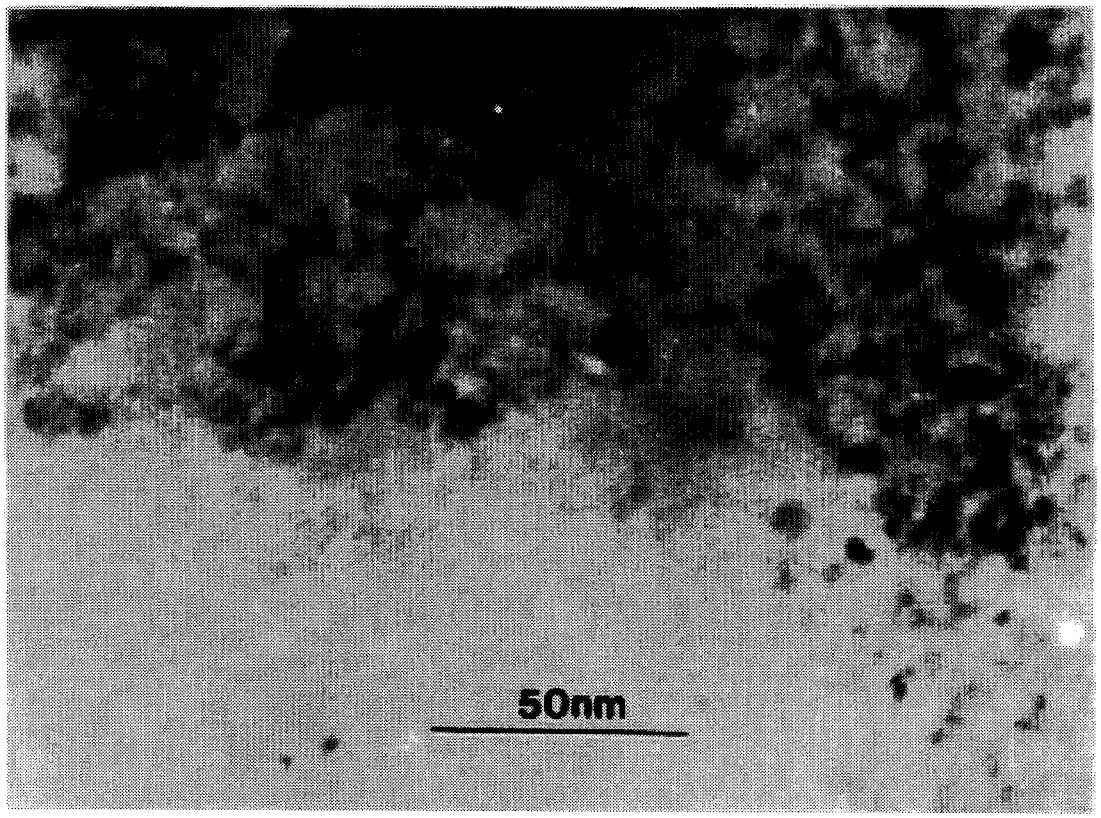
FIG. 5 is a high magnification transmission electron micrograph showing a monolayer of germanium nanocrystals which are patterned to produce a right angle.

A paraffin coated gold/palladium film is exposed to a colloidal solution of 4 nm average germanium particles in a polyvinyl alcohol solution. The germanium particle preparation is described in a copending United States patent application pertaining to the size dependent depression in the melting temperature of the Group IV semiconductors silicon and germanium, with reference to USSR patent 157,336. Upon dissolution of the paraffin mask a contiguous layer of germanium particles are observed in a pattern defined by the electron beam raster. The particles are observed to form a near monolayer coverage in the regions that had been irradiated; however unexposed regions remain free of particles, FIG. 5.

EXAMPLE 3

Figure 6:
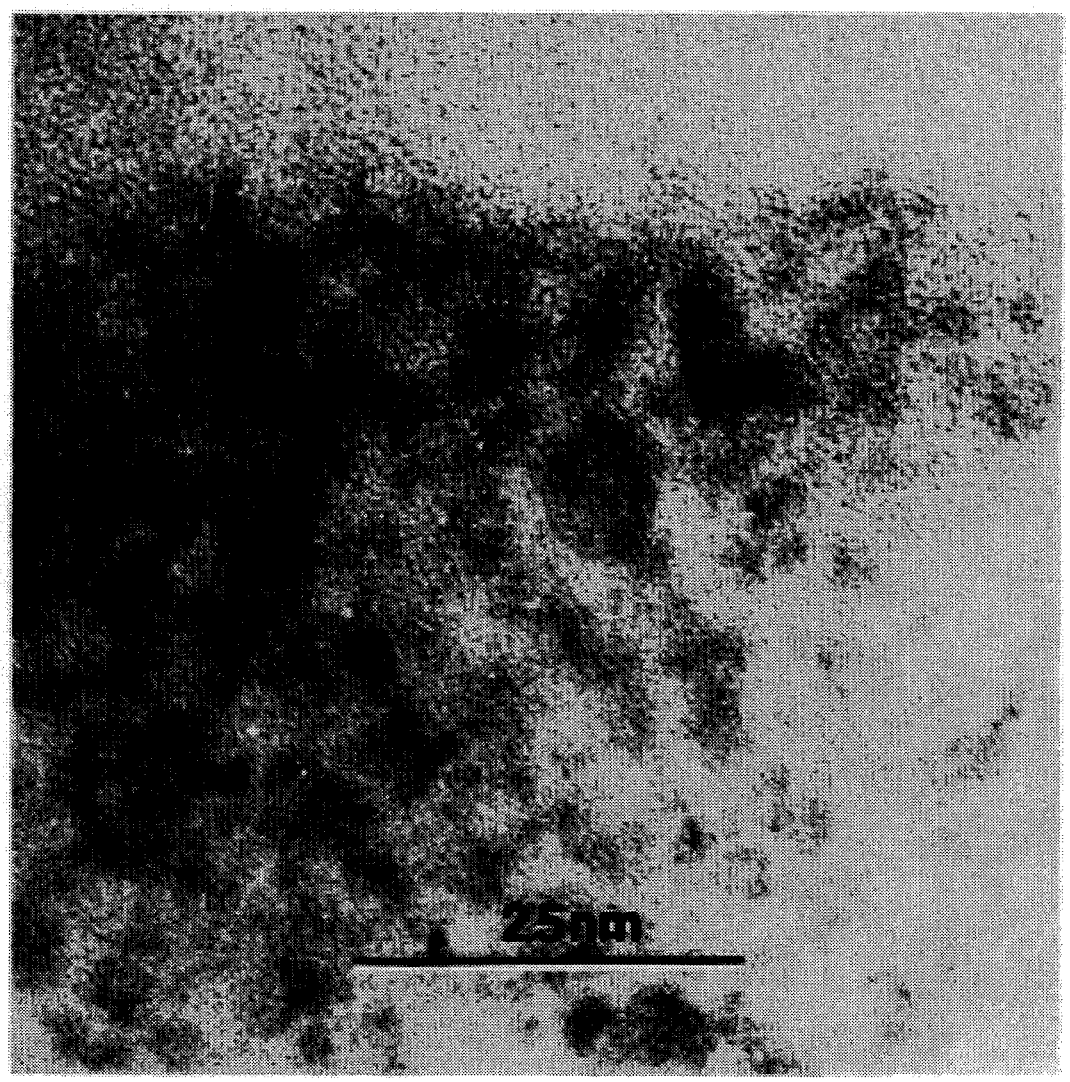
FIG. 6 is a high magnification transmission electron micrograph showing a monolayer of silicon nanocrystals contrasted against an amorphous palladium/gold substrate.

The process described in example 1 is repeated with a substrate of gold/palladium and silicon nanocrystals prepared by evaporation onto a liquid surface. Upon exposure of the substrate to a solution of the nanocrystals a selective adherence of particles is noted which corresponds to the regions irradiated by the electron beam, FIG. 6.

EXAMPLE 4

Figure 7:
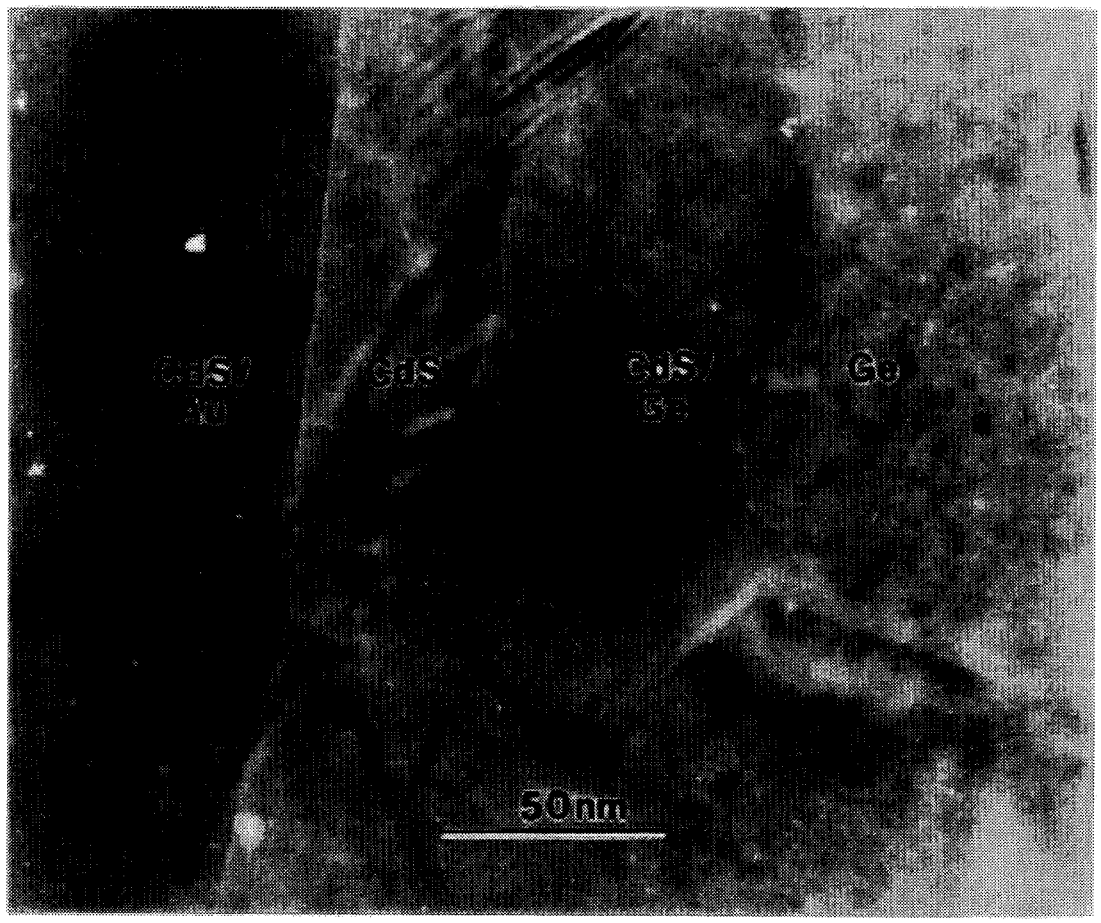
FIG. 7 is a transmission electron micrograph of layered materials wherein the electron dense region, a is a sintered gold film, b is the base substrate, c is a sintered CdS film and region d is a germanium particulate overlayer on sintered CdS. The thin films present are all derived from nanocrystal precursors.

The process described in example 1 is repeated sequentially with cadmium sulfide, gold and germanium nanocrystal solutions, with the first two material applications being followed by a sintering step. The multiple layers of material are visible in a pattern determined by the electron beam irradiation path, FIG. 7. The application of this variety of materials with spatial control indicates a number of nanostructured devices including electronic circuits, superlattices and quantum wells can readily be fashioned.

EXAMPLE 5

The process in example in example 4 is repeated using sequential exposure to silicon and gold nanocrystal solutions. The regions of particle adherence are dictated by the electron beam path.

EXAMPLE 6

The process in example 1 is repeated with a periodic occlusion of the electron beam on the mask resulting in a series of holes being formed in the organic mask. Upon exposure of the substrate to a cadmium sulfide nanocrystal solution, a controlled deposition of isolated nanocrystals results.

EXAMPLE 7

The process in example 6 is repeated using germanium particles, yielding the same controlled deposition of spatially isolated particles.

EXAMPLE 8

The process in example 6 is repeated using cadmium selenide particles, yielding the same controlled deposition of spatially isolated particles.

EXAMPLE 9

The process in example 6 is repeated using zinc oxide particles, yielding the same controlled deposition of spatially isolated particles.

EXAMPLE 10

The process in example 6 is repeated using mercury telluride particles, yielding the same controlled deposition of spatially isolated particles.

What is claimed is:

1. A process of patterning a material on a substrate using nanocrystalline precursors, comprising the steps of:
   (a) depositing onto the substrate a thin mask of an organic material which is susceptible to electron beam induced decomposition;
   (b) selectively decomposing a pattern into the mask using a directed electron beam;
   (c) depositing a thin layer of nanocrystalline particles onto the mask and substrate areas exposed by the decomposition;
   (d) dissolving the organic mask with a solvent; and
   (e) fusing the nanocrystals to yield a patterned thin film.

2. The process of claim 1 using nanocrystals with an average diameter of from 1 to 6 nm.

3. The process of claim 1 using nanocrystals of a semiconductor material.

4. The process of claim 1 using nanocrystals of a metal.

5. The process of claim 1 wherein step (e) is preceded by the step of covering the nanocrystals on the substrate with an overlayer of a nanocrystalline material so as to minimize volatilization during fusion.

6. The process of claim 1 wherein steps (a)–(e) are repeated to form a multi-layer structure.

7. A process of patterning a material on a substrate using nanocrystalline precursors, comprising the steps of:
   (a) depositing onto the substrate a thin mask of an organic material which is susceptible to electron beam induced decomposition;
   (b) selectively decomposing a pattern including spatially isolated pits into the mask using a directed electron beam;
   (c) depositing a thin layer of nanocrystalline particles onto the mask and substrate areas exposed by the decomposition;
   (d) dissolving the organic mask with a solvent; and
   (e) evaporating a protective coating onto the substrate and deposited nanocrystals.

8. The process of claim 7 wherein the protective coating is an optically transparent glass.

9. The process of claim 7 wherein the protective coating is metallic.

10. The process of claim 7 wherein the nanocrystal is a semiconductor of a size equal to or less than the size of the bulk exciton for the semiconductor in question.

* * * * *